Figure 1:
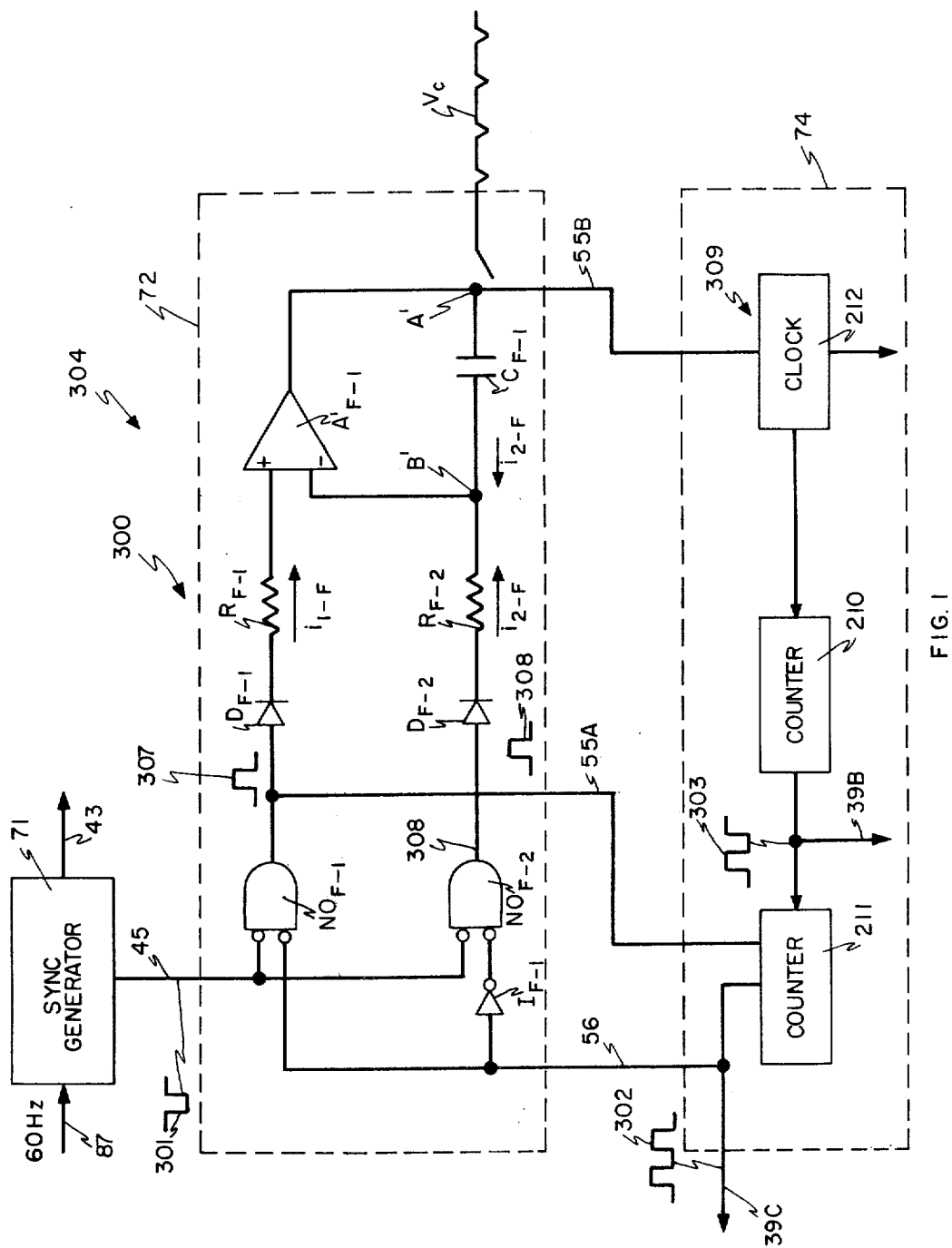

United States Patent [19]

Agans

[11] 4,009,449
[45] Feb. 22, 1977

[54] FREQUENCY LOCKED LOOP
[75] Inventor: David J. Agans, Boston, Mass.
[73] Assignee: Massachusetts Institute of Technology, Cambridge, Mass.
[22] Filed: Dec. 11, 1975
[21] Appl. No.: 640,106
[52] U.S. Cl. .............................. 331/16; 307/220 R; 331/12; 331/1 A
[51] Int. Cl.² ......................................... H03B 3/04
[58] Field of Search ...................... 331/16, 1 A, 12; 307/220

[56] References Cited

UNITED STATES PATENTS

| 3,286,191 | 11/1966 | Cornwell | 331/16 |
| 3,801,925 | 4/1974 | Parkyn | 331/16 |
| 3,840,822 | 10/1974 | Hoffmann | 331/16 |
| 3,872,397 | 3/1974 | Hanneman | 331/1 A |
| 3,943,460 | 3/1976 | Arai | 331/16 |

FOREIGN PATENTS OR APPLICATIONS 1,473,202  2/1967  France ................. 331/16

Primary Examiner—John Kominski
Attorney, Agent, or Firm—Arthur A. Smith, Jr.; Robert Shaw; Martin M. Santa

[57] ABSTRACT

A frequency locked loop that provides an output voltage waveform locked in frequency with an input voltage waveform. The output waveform is provided by a voltage controlled oscillator that is resettable to permit adjustment of the frequency of its output waveform.

7 Claims, 2 Drawing Figures

FREQUENCY LOCKED LOOP

The present invention relates to frequency locked loops.

There accompanies herewith an application for Letters Patent entitled "Electronic Games" (Dash et al), Ser. No. 640,105, filed Dec. 11, 1975; said application is hereby incorporated herein by reference. In the Dash et al application the raster scan beam of the television tube of a television receiver is controlled to provide on the image screen of the receiver simulated objects or components of a game. The circuitry to give the necessary results includes the frequency locked loop of this invention. In the explanation that follows, the invention is placed in the context of the circuitry of the Dash et al application, even though it has wider possibilities. In the explanation and throughout this specification the term "frequency" means 1/period; this point is emphasized because the waveforms that are locked in frequency can (and in the context of said application do) differ from one another: one is a sinusoid and the other is a square wave, but their periods and, hence, in this specification, their frequencies are locked.

Television receivers in this country with its sixty hertz power (i.e., $f_0$ hereinafter) require horizontal sync pulses at a rate of about 15750 pulses per second (i.e., $f_2$ hereinafter) and vertical sync pulses at a rate of 60 pulses per second. (The receivers can lock to a frequency that is slightly removed, say ~ 2 percent, from ideal sync pulse rates.) The system of said application employs analog circuitry and digital circuitry in a novel configuration to supply a product whose cost is extremely low to conform to the realities of the market place. The system employs a modulo 256 counter which, it is hereinafter shown, does not readily adapt to both the 15750 and 60 pulses per second rates, accordingly, it is an object of the invention to provide a frequency locked loop that provides a pulse rate at about 15750 pulses per second by locking to an input of 60 pulses per second derived from the power line waveform.

A further object is to provide such loop while, nevertheless, taking into consideration the constraints of a highly competitive market place.

These and still further objects are discussed hereinafter and are particularly pointed out in the appended claims.

The foregoing object are obtained in a frequency locked loop for use in a system wherein events are timed to occur on the basis of a periodic waveform whose frequency is $f_0$, comprising, in combination: sync generator means that produces a sampling pulse at the frequency $f_0$; counter means; voltage controlled clock means connected as clock input at a frequency $f_1$ to the counter means; control circuit means that generates a control voltage $V_c$ to control the output frequency $f_1$ of the clock means; said counter means comprising a first counter and a second counter, the first counter being connected to divide the clock frequency by $2^m$ to produce an output frequency $$f_2 = f_1/2^m,$$

the second counter being resettable and being connected to receive said output frequency $f_2$ as input and to provide as output a frequency which always equals the frequency $f_0$ and, when locked, $$f_3 = f_2/(2^n + K),$$

wherein $K$ is a circuit parameter and $m$ and $n$ are integers, the frequency $f_1$ being adjustable under the regulation of the control means to render the frequency $f_2$ locked to the frequency $f_0$ that serves as a standard for the electric system of which the frequency locked loop is a part in the relationship $$f_2 = f_0 (2^n + K);$$

and sampling means that receives as input the sampling pulse as well as a feedback signal from the output of the second counter and provides a reset pulse that is connected to reset the second counter at the frequency $f_0$ and a further pulse, the further pulse and the reset pulse being connected as input to the control circuit means to provide as output the voltage $V_c$. (The constant $K$ is also called herein a "dead zone" or "discontinuity" in the waveform of frequency $f_3$.)

Figure 2:
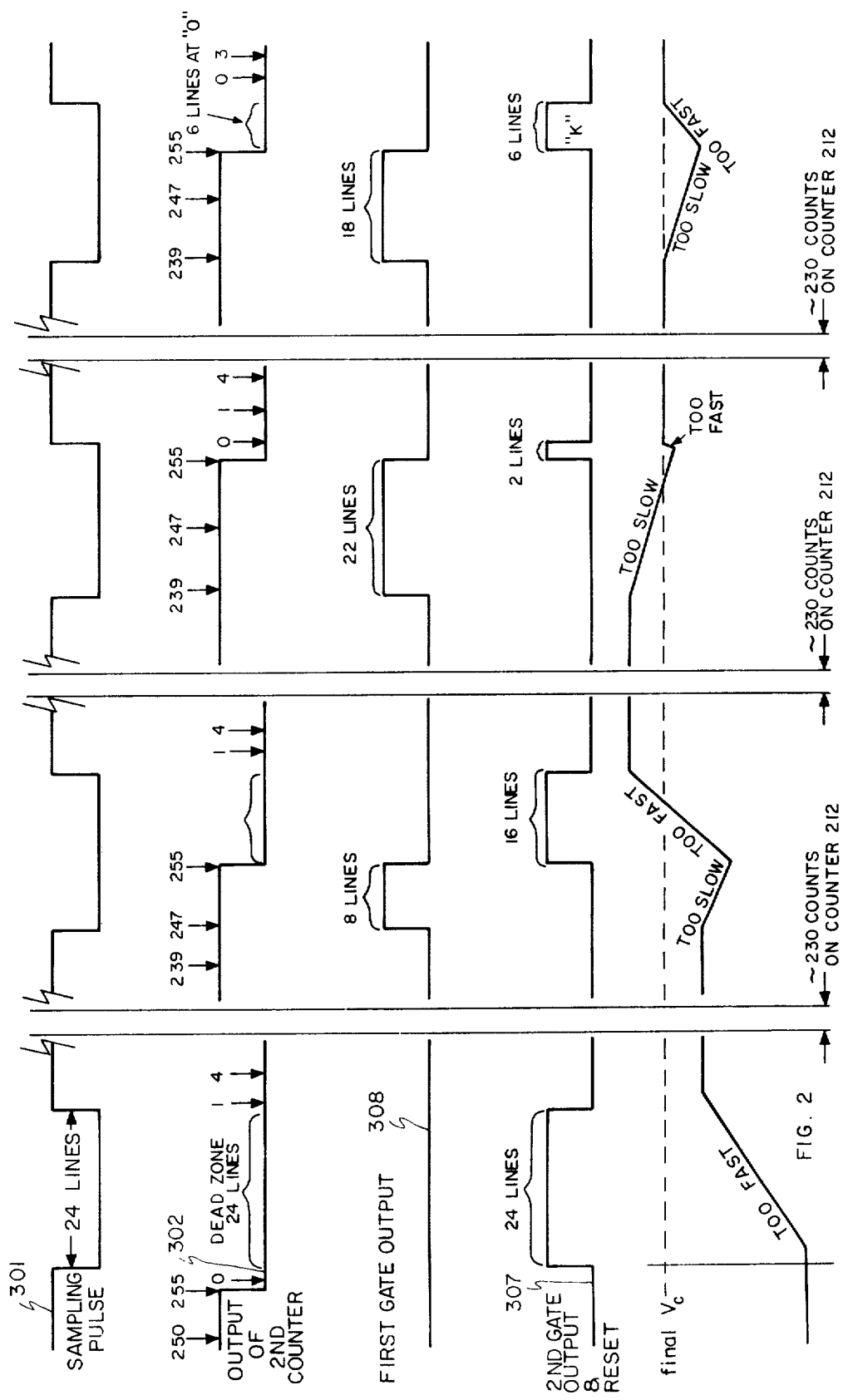

The invention is hereinafter discussed with reference to the accompanying drawing in which:

FIG. 1 is a schematic circuit diagram showing a preferred form of frequency locked loop embodying the present inventive concepts and including, among other things, a clock and two modulo ($2^n$) counters that together form a voltage controlled oscillator (VCO); and FIG. 2 shows voltage waveforms at various important points in the circuit of FIG. 1, including the output of the VCO.

In the explanation that now follows there first is given a brief overall description of the circuit of FIG. 1 to place matters in context, this is followed by some background information, and then the circuit is explained in detail.

The circuitry shown at 300 in FIG. 1 is a frequency locked loop (wherein, as above noted, frequency = 1/period); the loop 300 is part of a system 304 that further includes a sync generator 71. The input to the system 304 is a 60 Hz waveform ($f_0$ herein) on the conductor marked 87; the output of the system 304 and the output of the frequency locked loop 300 is a waveform 302 ($f_3$ herein) comprising voltage pulses. (As is well known in this art the waveform 302 is made up of 1s and 0s, a voltage pulse constituting a 1 and the absence of a voltage pulse constituting a zero. This is true also of later-discussed waveforms 301, 303, 307 and 308.) The frequencies $f_0$ and $f_3$ are locked, that is, the period of the waveform 302 equals the period of the waveform at the frequency $f_0$. The 60 Hz input, of course, comprises two half waves of equal time length, but, as later shown, the waveform 302 does not. One part of the waveform 302 contains a dead zone that is just sufficient to render the period of the waveform 302 equal to the 60 Hz input to the system 304.

The frequency locked loop 300 includes a frequency locked circuit 72 and three elements in a digital mapping circuit 74, which three elements are labeled 309 and together constitute a voltage controlled oscillator (VCO): the three elements in the VCO 309 are a voltage controlled clock 212, a first counter 210 and a second counter 211. The function of the frequency locked loop placed in the context of the circuitry of said application Ser. No. 640,105 is to synchronize the counting cycles of the counters 210 and 211, but the mission is accomplished by locking the frequency output of the VCO 309 at the conductor designated 39C with the 60 Hz input frequency at the conductor 87 which is input to the sync generator 71, as above indicated. The waveform 302 is the output of the counter 211 whose input is the waveform 303 that is the output of the counter 212 and that is delivered, also, to the conductor labeled 39B. For the reasons given herein, the frequency of the waveform 303 is about 15750 cycles per second ($f_2$ herein) which requires that the clock frequency ($f_1$ herein) be 126000 pulses per second. The counters 210 and 211 are modulo 256 counters.

As above noted, the television receiver requires horizontal sync pulses, the waveform 303 in FIG. 1, at a rate of about 15750 pulses per second, or 262½ pulses/vertical scan, frequency $f_2$ in this discussion. The receiver requires vertical sync pulses, the waveform 302 in FIG. 1, at about a rate of 60 pulses per second, the frequency $f_3$ herein. (The 60 cycle waveform is obtained from the ac line.) Unfortunately, in digital electronics of the type available at low prices and in quantity (i.e., modulo $2^n$ counters), the closest easy count to 262½ is 256 pulses per vertical scan. Counting 262½, in the absence of the present teaching, would take at least two extra integrated circuits — a requirement that should be avoided in the interest of cost constraints. In accordance with this teaching there is provided a 6½ pulse per second dead zone or discontinuity in the waveform 302 in order that the counter 211 will have about 60 pulses per second at its output while nevertheless having at its input about 262½ pulses per output pulse. The relationships of the above-noted frequencies are $$f_3 = f_0$$

$$f_2 = f_1/2^m$$

$$f_3 = f_1/(2^n + K).$$

wherein $K$ (i.e., a dead zone) is a circuit parameter (i.e., 6½ pulses per cycle of $f_2$ in the context of this explanation) and $m$ and $n$ are integers. In the loop 300, the lapse time between pulses in the waveform 302 differs from the pulse width, as hereinafter explained with reference to FIG. 2. A further constraint on the system is that the frequency $f_2$ must be within ± 2% without need of production trimming techniques — again a cost factor.

The frequency locked loop 300 includes the voltage controlled oscillator 309 that comprises the clock 212, the first counter 210 and the second counter 211, as above indicated; the VCO 309 has reset capability. Reset is accomplished by a NOR-gate NO$_{F-1}$ which resets the second counter 211 but which does so in a way that establishes the dead zone, that is, the counter 211 sees a zero input irrespective of whether the input is, in fact, zero, so that the counter is held at reset for the time lapse of the dead zone. Sampling means that comprises an inverter I$_{F-1}$, the NOR-gate NO$_{F-1}$ and a NOR-gate NO$_{F-2}$ periodically samples the output of the VCO 309. Sampling occurs when the pulse 301 (of pulse width or pulse time ~24 input counts of the counter 211) that emits from the sync generator 71 provides one input to the NOR-gates along a conductor 45, the other input coming from the counter 211 along a conductor 56. The outputs of the NOR-gates NO$_{F-1}$ and NO$_{F-2}$ are voltage waveforms 307 and 308, respectively, composed of 1s (of time duration $\tau_2$ and $\tau_1$, respectively) and 0s, as before indicated. Control circuit means, comprising diodes D$_{F-1}$ and D$_{F-2}$, resistors R$_{F-1}$ and R$_{F-2}$, a Norton operational amplifier A$_{F-1}$ and a capacitor C$_{F-1}$, generates the control voltage (V$_c$) of the VCO 309 to adjust the frequency $f_1$ of the clock 212, and, hence, the output frequency $f_3$. In this way, the output frequency $f_3$ of the frequency locked loop, that is periodic, is locked in frequency to the frequency $f_0$ at its input. The control voltage V$_c$ as shown, is connected along a conductor 55B to the clock 212. The output frequency $f_1$ of the clock 212 is proportional to $1/V_c$, that is, an increase in V$_c$ lowers $f_1$ and in a decrease in V$_c$ increases $f_1$. The value of the control voltage V$_c$ is determined by integrating various signals in the frequency locked circuit 72 by the Norton operational amplifier A$_{F-1}$ with negative feedback and the capacitor C$_{F-1}$ which together constitute an integrator, as now explained.

As above indicated, the period of the waveform 302 (and hence the frequency $f_3$ thereof) is determined, in part, by the magnitude of the control voltage V$_c$ (and is adjustable by adjusting the voltage V$_c$) to the clock 212 and, in part, by the magnitude of the circuit parameter K, which magnitude is established by the width of a reset pulse (i.e., a 1 in voltage waveform 307) along the conductor 55A to the second counter 211. The width of a 1-pulse of the waveform 307 also enters into the determination of the amplitude of the voltage V$_c$, as hereinafter explained, as does, as well, the width of a 1-pulse of the waveform 308, i.e., the times $\tau_2$ and $\tau_1$, respectively. It is in order, therefore to discuss in some detail how the times $\tau_1$ and $\tau_2$ are established.

A 1-pulse appears at the output of the NOR-gate NO$_{F-1}$ whenever there is a 1 output from the counter 211 and a sampling pulse 301 present and a 1-pulse appears at the output of the NOR-gate NO$_{F-2}$ whenever there is a 0 output from the counter 211 and a sampling pulse 301 present. Hence the sum of the times $\tau_1$ and $\tau_2$ is determined by the width $\tau_0$ of the sampling pulse 301, but the individual times are determined by the state of the waveform 302 (whether it is a 1 or a 0). The waveforms 307 and 308 are fed as input to a weighted differential integrator whose output is the voltage V$_c$ and which consists of the resistors R$_{F-1}$ and R$_{F-2}$, the amplifier A$_{F-1}$ and the capacitor C$_{F-1}$, the output V$_c$ of said weighted differential integrator changes on every sampling pulse by the value $$\Delta V_c = \int_{\tau_2} A - \int_{\tau_1} B.$$

where $A$ and $B$ are predetermined weighting constants $$\left( \text{i.e., } A \sim \frac{1}{R_{F-1}} \text{ and } B \sim \frac{1}{R_{F-2}} \right).$$

The voltage $V_c$ settles to a constant amplitude or value when $V_c = 0$, or $$\frac{\tau_1}{\tau_2} = \frac{A}{B} = \frac{R_{F-2}}{R_{F-1}}$$

The reset pulse (i.e., 1-pulse of the waveform 307) as used herein is the second output of the gate means comprising the NOR-gate $NO_{F-1}$ and $NO_{F-2}$, that is, the reset pulse is a 1 from the NOR-gate $NO_{F-1}$. The second counter 211, once it goes to 0, stays there until the sampling pulse 301 is over and the circuit parameter K settles to the number $$K = \frac{B}{B+A} \cdot \tau_0 \cdot f_2$$

where, as above stated, $\tau_0$ is the length of the sampling pulse 301.

It can be seen on the basis of the foregoing that the frequency $f_3$ locks to the frequency $f_0$ by virtue of changes wrought upon the VCO 309 by the elements in the frequency locked circuit 72 upon the voltage $V_c$ and, to a much lesser extent, upon the time $\tau_2$ and, hence, the value of K. The adjustment is accomplished by sampling the output of the second counter 211, as explained above, when a fixed fraction of one period of the waveform at the frequency $f_0$ has been completed and a determination is made as to whether the second counter 211 has completed more than or less than the same fixed fraction of one period of its own required output waveform when the sample is taken; if not, appropriate changes are made in the magnitude of the voltage $V_c$, in the manner outlined in the previous paragraph, so that, after a few cycles of operation, both the waveform of the frequency $f_0$ and the waveform at the frequency $f_3$ complete said fraction of their total period in the same length of time.

The frequency locked loop herein disclosed permits use of analog and digital circuitry in the system of said patent application Ser. No. 640,105 and yet provides a master controller for said system which is compatible with most television sets. The master controller thus provided can be made without the need for final production trimming to provide a duty cycle that is compatible with available television sets, and the master controller, thus provided, avoids problems with timing due to age of the system. In short, the system can be made relatively inexpensively but is, nevertheless, quite accurate and dependable.

Thus, the integrator stabilizes the voltage $V_c$ when the ratio of the pulse width of the NOR-gate $NOR_{F-1}$ to that of the NOR-gate $NOR_{F-2}$ reaches the resistance ratio $R_{F-1}/R_{F-2}$, such that the total current into the negative input (−) of the integrator equals the total current into the positive (+) input of the integrator, and the control voltage dips down, and then climbs back up immediately, each 1/60 sec., during the presence of the sampling pulse 301. By adjusting the resistors $R_{F-1}$ and $R_{F-2}$, the two pulse widths can be weighted so that the width of a 1 pulse waveform 307 (i.e., the reset pulse) is, say one-fourth of a 26-count sampling pulse, so that the pulse 307 and, hence, the dead zone, is 6½ counts long.

It will be apparent on the basis of the above explanation that the frequency locked loop 300 can be described in terms of locking any one of the frequencies $f_1$, $f_2$ or $f_3$ to the frequency $f_0$. In these terms the relationships are $$f_3 = f_0,$$

$$f_2 = f_0 (2^n + K), \text{ and}$$

$$f_1 = f_0 \cdot D,$$

wherein, in the circuit of the frequency locked loop 300, $D = (2^n + K) 2^m$.

Modifications of the invention herein described will occur to persons skilled in the art and all such modifications are deemed to be within the spirit and scope of the invention as defined by the appended claims.

What is claimed is:

1. A frequency locked loop for use in a system wherein events are timed to occur on the basis of a periodic waveform whose frequency is $f_0$, comprising, in combination: sync generator means that produces a sampling pulse at the frequency $f_0$, counter means; voltage controlled clock means connected as clock input at a frequency $f_1$ to the counter means; control circuit means that generates a control voltage $V_c$ to control the output frequency $f_1$ of the clock means; said counter means comprising a first counter and a second counter, the first counter being connected to divide the clock frequency by $2^m$ to produce an output frequency $$f_2 = f_1/2^m,$$

the second counter being resettable and being connected to receive said output frequency $f_2$ as input and to provide as output a frequency which always equals the frequency $f_0$ and, when locked, $$f_3 = f_2/(2^n + K),$$

wherein K is a circuit parameter and $m$ and $n$ are integers, the frequency $f_1$ being adjustable under the regulation of the control means to render the frequency $f_2$ locked to the frequency $f_0$ that serves as a standard for the electric system of which the frequency locked loop is a part in the relationship $$f_2 = f_0 (2^n + K);$$

and sampling means that receives as input the sampling pulse as well as a feedback signal from the output of the second counter and provides a reset pulse that is connected to reset the second counter and a further pulse, the further pulse and the reset pulse being connected as input to the control circuit means to provide as output the voltage $V_c$.

2. A frequency locked loop as claimed in claim 1 wherein the means sampling comprises gate means which generate two outputs; the first being 1 only when the output of the second counter is 1 and a sampling pulse is present, the second being 1 only when the output of the second counter is 0 and the same sampling pulse is present.

3. A frequency locked loop as claimed in claim 2 wherein the sampling pulse occurs at a time such that the desired fraction of the output waveform of the second counter at that particular time is $$\frac{2^n}{2^n} + K,$$

such that, if the frequency $f_2$ is correct, the output will change from a 1 to a 0 at a particular point during the sampling pulse, and each of the outputs of the gate means is a 1 for some portion of the sampling pulse.

4. A frequency locked loop as claimed in claim 3 wherein the means to adjust the control voltage $V_c$ to the clock means comprises a weighted differential integrator whose output $V_c$ is given by $$\tau_2 A - \tau_1 B$$

where $A$ and $B$ are predetermined weighting constants, such that it settles to a constant value when the ratio of the length $\tau_1$ of the first output pulse to the length $\tau_2$ of the second pulse equals the ratio A/B.

5. A frequency locked loop as claimed in claim 4 wherein the reset pulse is the second output of the gate means, such that the second counter, once it goes to 0, stays there until the sampling pulse is over, and the circuit parameter K settles to the number $$K = \frac{B}{B + A} \cdot \tau_0 \cdot f_1$$

6. An electric system wherein events are timed to occur on the basis of a periodic signal whose frequency is $f_0$, that comprises, in combination: counter means having reset capability; clock means connected as clock input at a frequency $f_1$ to the counter means; frequency locked circuit means operable to control the output frequency $f_1$ of the clock means as well as to reset the counter means at the frequency $f_0$; said counter means comprising a first counter and a second counter, the first counter being connected to receive the input thereto at the frequency $f_1$ and to divide same by $2^m$ to produce an output at a frequency $$f_2 = \frac{f_1}{2^m}$$

the second counter being connected to receive said output at a frequency $f_2$ as clock input thereto and to provide an output at a frequency $$f_3 = \frac{f_1}{2^m(2^n + K)}.$$

wherein $K$ is a circuit parameter and $m$ and $n$ are integers; means to introduce a sampling pulse at the frequency $f_0$ to the frequency locked circuit means as one input thereto; and feedback means from the output of the second counter as a further input to the frequency locked circuit means.

7. For use in a circuit in an electric system wherein events are timed to occur on the basis of a periodic voltage waveform whose frequency is $f_0$, a frequency locked loop comprising, in combination: voltage controlled clock means oscillating at a frequency $f_1$, the frequency $f_1$ being adjustable on the basis of a control voltage $V_c$ to provide, when locked, the relationship $f_1 = f_0 \times D$, wherein $D$ is a designer-adjustable circuit parameter; resettable counter means connected to count cycles of the clock means, circuit means to reset the counter periodically and at the frequency $f_0$ and to sample the output of the counter means when a fixed fraction of one period of the waveform at the frequency $f_0$ has been completed and to determine whether the counter means has counted the same fixed fraction D of cycles of $f_1$ when the sample is taken, and control circuit means to generate the control voltage $V_c$ applied to the voltage controlled clock means and to adjust to voltage $V_c$ so that after a few cycles of system operation the voltage controlled clock means is able to complete D cycles during each period of the input frequency $f_0$ such that the frequency $f_1 = f_0 \times D$.

* * * * *